United States Patent
El-Chammas

(10) Patent No.: US 9,941,896 B2
(45) Date of Patent: Apr. 10, 2018

(54) ANALOG TO DIGITAL CONVERTER ERROR RATE REDUCTION

(71) Applicant: TEXAS INSTRUMENTS INCORPORATED, Dallas, TX (US)

(72) Inventor: Manar Ibrahim El-Chammas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/294,227

(22) Filed: Oct. 14, 2016

(65) Prior Publication Data

US 2017/0111055 A1  Apr. 20, 2017

Related U.S. Application Data

(60) Provisional application No. 62/242,222, filed on Oct. 15, 2015.

(51) Int. Cl.
  *H03M 1/34* (2006.01)
  *H03M 1/12* (2006.01)
  *H03M 1/16* (2006.01)

(52) U.S. Cl.
  CPC ............ *H03M 1/129* (2013.01); *H03M 1/164* (2013.01)

(58) Field of Classification Search
  CPC ......... H03M 1/46; H03M 1/129; H03M 1/164

USPC .......................................... 341/158–159, 161
See application file for complete search history.

(56) References Cited

U.S. PATENT DOCUMENTS

| | | | | |
|---|---|---|---|---|
| 6,741,194 B1 * | 5/2004 | Cassagnes | ............ | H03M 1/129 341/118 |
| 6,803,873 B1 * | 10/2004 | Motomatsu | ......... | H03M 1/0695 341/155 |
| 7,623,051 B2 * | 11/2009 | Murden | .............. | H03M 1/0809 341/120 |
| 7,750,834 B2 * | 7/2010 | Sasaki | .................... | H03M 1/08 341/156 |

* cited by examiner

*Primary Examiner* — Khai M Nguyen
(74) *Attorney, Agent, or Firm* — William B. Kempler; Charles A. Brill; Frank D. Cimino

(57) ABSTRACT

An analog-to-digital converter (ADC) may include a comparator and a metastability detector. The comparator may be configured to compare an input signal to a reference signal to determine whether the input signal exceeds the reference signal. The comparator may also be configured to output a comparator output based on the determination. An ADC output may be based at least in part on the comparator output. The metastability detector may be coupled to the comparator and may be configured to determine, based at least in part on the comparator output, that the comparator is operating under metastable conditions and may output a metastability detector output.

18 Claims, 2 Drawing Sheets

US 9,941,896 B2

ANALOG TO DIGITAL CONVERTER ERROR RATE REDUCTION

CROSS-REFERENCE TO RELATED APPLICATIONS

The present application claims priority to U.S. Provisional Patent Application No. 62/242,222, filed Oct. 15, 2015, titled "Reducing Error Rates in Pipelined ADCs," which is hereby incorporated herein by reference in its entirety.

BACKGROUND

Digital systems that output a logical high signal (e.g., a digital "1" representing that an output of the digital system exceeds a predefined threshold defining logical high signals) or a logical low signal (e.g., a digital "0" representing that an output of the digital system is less than a predefined threshold defining logical low signals) may suffer from metastability. Metastability may be a circumstance in which an output of a digital system is neither high (e.g., "1") nor low (e.g., "0"), but is instead some unknown value between the predefined threshold defining logical low signals and the predefined threshold defining logical high signals. Such metastability may result in errors in the digital system's output that, in some circumstances, may affect a reliability or usability of the digital system for a particular purpose.

SUMMARY

In some embodiments an analog-to-digital converter (ADC) may include a comparator and a metastability detector. The comparator may be configured to compare an input signal to a reference signal to determine whether the input signal exceeds the reference signal. The comparator may also be configured to output a comparator output based on the determination. An ADC output may be based at least in part on the comparator output. The metastability detector may be coupled to the comparator and may be configured to determine, based at least in part on the comparator output, that the comparator is operating under metastable conditions and may output a metastability detector output.

A pipelined apparatus may include at least one segment that may be configured to receive an input signal. That at least one segment may include an ADC that may include a comparator configured to receive the input signal and may be configured to compare the input signal to a reference signal to determine whether the input signal exceeds the reference signal. The comparator may also be configured to output a comparator output based on the determination. The ADC may also include a metastability detector that may be coupled to the comparator and may be configured to determine that the comparator is operating under metastable conditions and output a metastability detector output. The comparator operating under metastable conditions may comprise the comparator output existing outside of an accepted or predetermined range for the comparator output. The predetermined range may be based, in some embodiments, on minimum and/or maximum thresholds for logic high and/or low (e.g., digital; "1" and/or digital "0") output signals, and in one example, may correspond to the range between the minimum and maximum thresholds. The at least one segment may also include an encoder that may be coupled to the ADC and may be configured to receive the comparator output and generate an ADC output based at least in part on the comparator output. The at least one segment may also include a digital-to-analog converter (DAC) that may be coupled to the ADC and the encoder and may be configured to convert the ADC output to an analog output signal. The at least one segment may also include a subtractor that may be coupled to the input signal and the DAC and may be configured to subtract the analog output signal from the input signal to form a residual output signal.

A method of ADC metastability detection and correction may include receiving, by an ADC an analog input signal for conversion to a digital value as an ADC output. The method may also include comparing, by a comparator of the ADC, the analog input signal to a reference signal to generate a comparator output. The method may also include determining, by a metastability detector and based on the comparator output, that the comparator is operating under metastable conditions to generate a detector output. The method may also include replacing, by a digital backend, the ADC output with an estimated output upon the digital backend receiving the detector output indicating that the comparator is operating under metastable conditions.

BRIEF DESCRIPTION OF THE DRAWINGS

For a detailed description of various examples, reference will now be made to the accompanying drawings in which.

DETAILED DESCRIPTION

As discussed below, an analog-to-digital converter (ADC) may convert an analog voltage magnitude to a digital value representative of the analog voltage magnitude based on a plurality of comparators included in the ADC. The ADC may operate under metastable conditions when any one or more of the comparators have not regenerated prior to the comparator generating the digital value. A comparator is considered to have regenerated when an absolute value of a difference between differential outputs of the comparator exceeds a voltage magnitude expected by a subsequent electrical component. For example, in applications of an ADC in which an input signal (e.g., the analog voltage magnitude) of the ADC is small (e.g., with respect to at least one reference signal associated with the ADC), an amount of time between generating a first digital output and generating a second digital output may be insufficient to allow the comparator to regenerate. As such, the second digital output of the comparator may be neither a "1" nor a "0," thereby causing an error in an output of the ADC.

Disclosed herein are various embodiments that provide for reducing an error rate of ADCs. The disclosed embodiments may provide one or more methods, apparatus, and/or systems that may determine whether an ADC is operating under metastable conditions (e.g., an output of the ADC is neither a "1" nor a "0"). The disclosed embodiments may further provide one or more methods, apparatus, and/or systems that may correct or compensate an output of an ADC that is operating under metastable conditions.

An ADC may include a detection circuit that may be configured to determine whether the ADC is operating under metastable conditions. The detection circuit may, in some embodiments, comprise an exclusive OR (XOR) digital logic gate. In other embodiments, the detection circuit may comprise one or more comparators that may be coupled to one or more digital logic components and may be configured to determine whether the ADC is operating under metastable conditions. Based on a determination by the detection circuit that the ADC is operating under metastable conditions, and thus an output of the ADC may be erroneous, the output of the ADC may be replaced by a predefined value. For example, the predefined value may be an approximation of an expected output of the ADC. The approximation may be based on, for example, a threshold of a comparator of the ADC and/or a residue of an ADC segment of a pipelined ADC. The predefined value may be stored in a data store or data structure such as a lookup table or database accessible by a digital backend that may access the lookup table or database to replace the output of the ADC with the predefined value when the detection circuit indicates that the ADC is operating under metastable conditions.

Figure 1:
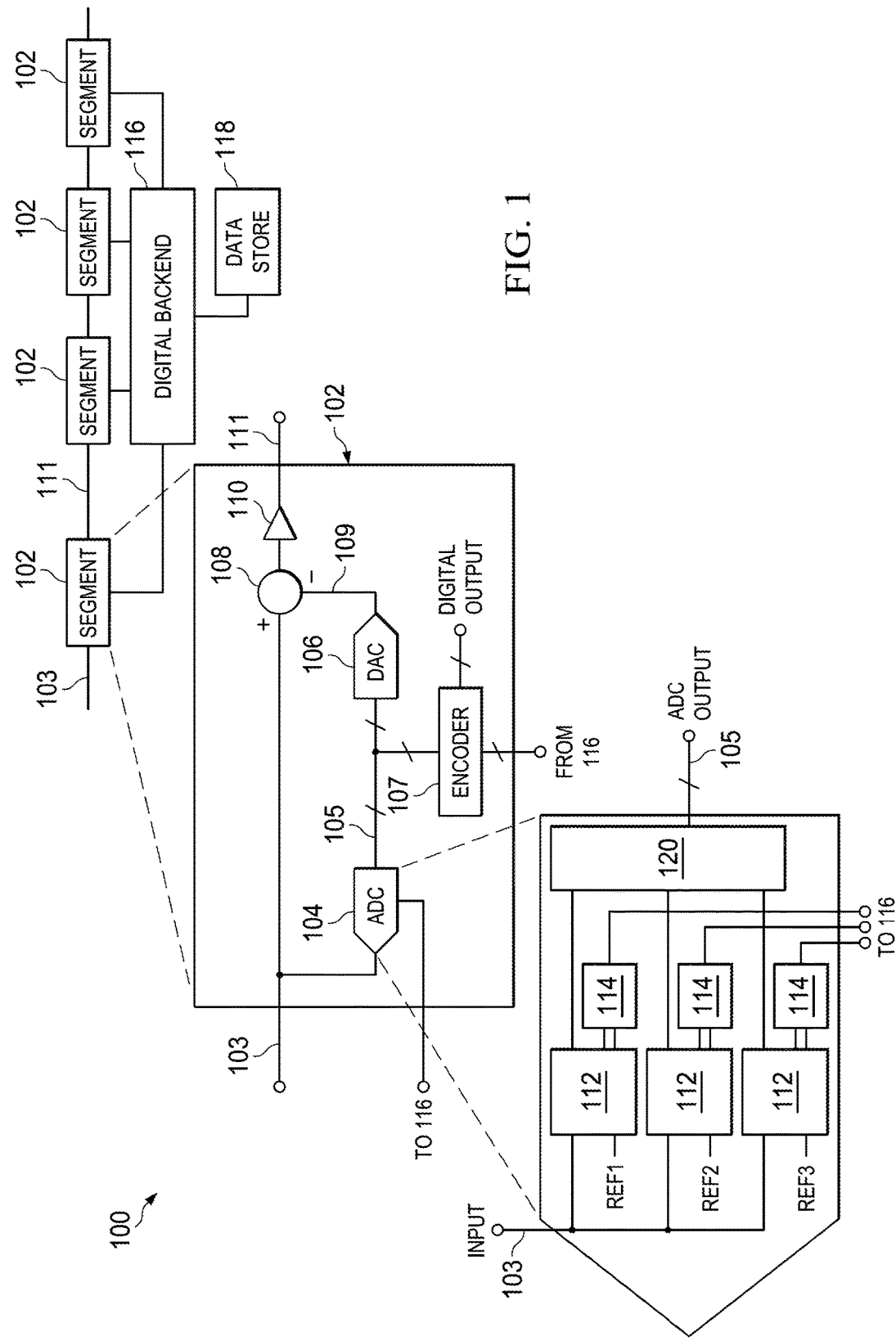
FIG. 1 shows a schematic diagram of a pipelined ADC with metastable detection in accordance with various embodiments.

FIG. 1 shows a schematic diagram of a pipelined ADC 100 with metastable detection in accordance with various embodiments. The pipelined ADC 100 may be configured to receive an analog input 103 (e.g., an analog signal represented by a voltage magnitude or amplitude) and output a corresponding digital output value (e.g., represented as one or more digital bits) based on the received analog input 103. For example, the pipelined ADC 100 may convert the received analog input 103 to the corresponding digital value or may detect and/or analyze the received analog input 103 and generate the digital value based on the detected and/or analyzed analog input 103. The pipelined ADC 100 may include a plurality of segments 102, each of which may be configured to convert a portion of the analog input 103 to the corresponding digital value. For example, a pipelined ADC 100 may be configured to output a ten bit digital value using five segments 102 that each output two bits. Similarly, the ten bit digital value may be formed by two segments 102 each outputting five bits, ten segments 102 each outputting one bit, etc. Generally, the digital value output by the pipelined ADC 100 may have a number of bits determined according to a cumulative total of the number of bits output by the plurality of segments 102.

Each segment 102 may include an ADC 104, a DAC 106, an encoder 107, a subtractor 108, and an amplifier 110. The ADC 104 may be configured to receive the analog input 103 of the segment 102 and convert the analog input 103 into a digital value 105. The ADC 104 may, in some embodiments, be a flash ADC that may be configured to convert the analog input 103 into the digital value 105 based on a plurality of comparators 112 configured to compare the analog input 103 to a plurality of respective reference signals (e.g., the reference signals ref1, ref2, and ref3) and output a result of the comparison. In some embodiments, and encoder 120 may be coupled to each of the comparators 112 and configured to generate the digital value 105 based on the results of the comparison performed by the comparators 112 (e.g., by shifting, arranging, or otherwise transforming or manipulating the outputs of the comparators 112 received by the encoder 120). For example, when the analog input 103 to a comparator 112 exceeds a magnitude of the reference signal, the comparator 112 may output a "1," and may otherwise output a "0." The number of comparators 112 included in each ADC 104 may be related to a desired resolution of the ADC 104 (e.g., a number of portions into which the analog input 103 may be divided for conversion into the digital value 105) and/or may be the number of digital bits the digital value 105 output by the ADC 104 (and correspondingly by the respective segment 102 that includes the ADC 104). For example, an ADC 104 that outputs a digital value 105 that includes two digital bits, the ADC 104 may include three comparators 112. Alternatively, for an ADC 104 that outputs a digital value 105 that includes three digital bits, the ADC 104 may include a greater number of comparators 112 than the number of digital bits that are output by the segment 102, in which case the encoder 120, or another suitable form of selection or processing circuitry or logic (e.g., an adder, a subtractor, etc.) may be used to determine the digital bits that are included in the digital value 105 based on the outputs of the comparators 112. While the ADC 104 is illustrated for exemplary purposes as having three comparators, the ADC 104 may include any number of comparators and output any number of bits as chosen by a particular application or design implementation of the ADC 104, segment 102, and/or pipelined ADC 100.

Each comparator 112 may be coupled to one of a plurality of metastability detectors 114 within the ADC 104. Alternatively, in some embodiments the metastability detectors 114 may be located external to the ADC 104 and coupled to the comparators 112. The comparators 112 may include, in some embodiments, a latch, and be referred to as latched comparators. In some embodiments, the latch may be configured to output a differential output (e.g., a positive or non-inverting output and a negative or inverting output) to the metastability detector 114. Such comparators may be referred to as differential latched comparators. The metastability detectors 114 may be implemented, in various embodiments, as one or more digital logic gates (e.g., an exclusive OR (XOR) gate, a negative OR (NOR) gate, an AND gate). The metastability detectors 114 may determine, based at least in part on the differential outputs of the comparators 112, whether a respective comparator 112 (and correspondingly a respective ADC 104) is operating under metastable conditions. For example, the metastability detectors 114 may determine that a respective comparator 112 is operating under metastable conditions if the positive output of the differential output of the comparator 112 is less than a threshold for a "1" and the negative output of the differential output of the comparator 112 is greater than a threshold for a "0." Alternatively, each comparator 112 may be configured to output a single output to a corresponding metastability detector 114, for example, a single output of a differential output of the comparator 112 or a non-differential output of the comparator 112. In such embodiments, the metastability detector 114 may compare the single output of the comparator 112 to reference value (e.g., a reference value indicative of a nominal or expected value of the single output of the comparator 112, a reference value indicative of a binary opposite of the nominal or expected value of the single output of the comparator 112, or any other suitable reference value). Generally, the metastability detectors 114 may be defined as any circuitry suitable, or configurable, to determine, for each comparator 112, whether $abs(O_p - O_m) > V_x$, where $O_p$ is the positive output of the differential output of the comparator 112, $O_m$ is the negative output of the differential output of the comparator 112, $V_x$ is a predefined reference level or threshold (e.g., a voltage level expected by a subsequent component in the ADC 104 or segment 102), and abs(x) corresponds to the absolute value of x. When $abs(O_p - O_m) > V_x$, the metastability detector 114 may output a first binary output value to indicate that the respective comparator 112 is not operating under metastable conditions. When $abs(O_p - O_m) < V_x$, the metastability detector 114 may output a second binary output, that is a binary opposite of the first binary output, to indicate that the respective comparator 112 is operating under metastable conditions. For example, when the metastability detector 114 is implemented as a XOR gate, the metastability detector may determine whether the positive output of the differential output of the comparator 112 and the negative output of the differential output of the comparator 112 are approximately equal, in which cause the metastability detector 114 may output a "1," or whether the positive output of the differential output of the comparator 112 and the negative output of the differential output of the comparator 112 are binary opposite, in which cause the metastability detector 114 may output a "0."

In other embodiments, the metastability detector 114 may be implemented as one or more detection comparators (e.g., comparators used for metastability detection) coupled to one or more digital logic components. For example, a positive differential output of a comparator 112 may be coupled to a first detection comparator and compared to a first reference signal (e.g., a first reference signal having a voltage approximately equal to a minimum threshold for a logical high (e.g., "1") signal). A negative differential output of the comparator 112 may be coupled to a second detection comparator and compared to a second reference signal (e.g., a second reference signal having a voltage approximately equal to a maximum threshold for a logical low (e.g., "0") signal). Each detection comparator may be coupled to one or more digital logic gates (e.g., XOR, NOR, AND, OR, etc.) that may, in combination with the detection comparators, be configured to determine whether $abs(O_p-O_m)>V_x$ or $abs(O_p-O_m)<V_x$, as discussed above.

The DAC 106 may be coupled to the ADC 104 and configured to receive the digital value 105 output by the ADC 104. The DAC 106 may convert the received digital value 105 into an analog signal. The DAC 106 may convert the digital value 105 to the analog signal 109 according to any suitable means, details of which are not limited herein. The encoder 107 may also be coupled to the ADC 104 and configured to receive the digital value 105 output by the ADC 104. While illustrated as being a component within each segment 102, the encoder 107 may, in some embodiments, be located external to the segment 102 and coupled to the segment 102. Also, while illustrated as each segment 102 having its own encoder 107, one or more segments 102 may be configured to utilize a common encoder 107 that may be shared among the one or more segments 102. The encoder 107 may receive the digital value 105 output by the ADC 104 and determine (e.g., by replacing, shifting, arranging, or otherwise transforming or manipulating the digital value 105) a digital output of the segment 102 based on at least one of the digital value 105, a position of the segment 102 in the pipelined ADC 100, an estimated output received from the digital backend 116 (discussed below), or other suitable criteria. In some embodiments, segment 102 may not include encoder 107. In such embodiments, the digital value 105 output by the ADC 104 may form the digital output of the segment 102, and the digital output of the segment 102 may be coupled to the digital backend 116 for further processing.

The subtractor 108 may be configured to receive the analog input 103 of the segment 102 and the analog signal 109 output by the DAC 106. The subtractor 108 may subtract the analog signal 109 output by the DAC 106 from the analog input 103 of the segment 102 to form a residual output 111 (or residue output 111) of the segment 102 that is passed to the amplifier 110 for amplification prior to transmission to a subsequent segment 102 in the pipelined ADC 100. In this way, each segment 102 may perform coarse analog to digital conversion with each successive segment 102 in the pipelined ADC 100 progressively increasing a precision of a value of the digital output of the pipelined ADC 100.

The pipelined ADC 100 may also include, or be coupled to, a digital backend 116. The digital backend 116 may be configured to receive, at least, the outputs of the metastability detectors 114 (e.g., the digital backend may be coupled to each individual metastability detector 114). The digital backend 116 may further be configured to transmit an estimated output of an ADC 104 to the encoder 107, the ADC 104, and/or the DAC 106. Based on the output of the metastability detectors 114, the digital backend 116 may correct an output of an ADC 104 having one or more comparators 112 operating under metastable conditions. For example, the comparators 112 may operate under metastable conditions near their respective reference signals, discussed above. Based on this, the digital backend 116 may determine (e.g., predetermine and store) an estimate of a digital value 105 output by an ADC 104 corresponding to metastability of each comparator 112. When a metastability detector 114 indicates that a comparator 112 is operating under metastable conditions, the digital backend 116 may replace the digital value 105 output by the ADC 104 with the estimated output based on which comparator 112 in the ADC 104 is operating under metastable conditions. While illustrated as being connected to the encoder 107, the digital backend 116 may replace the digital value 105 output by the ADC 104 with the estimated output by transmitting the estimated output to any one or more of the ADC 104 (connection not shown), the DAC 106 (connection not shown), and/or the encoder 107. Replacing the digital value 105 output by the ADC 104 with the estimated output when a comparator 112 of the ADC 104 is operating under metastable conditions may, in some embodiments, improve a precision and/or reduce an error rate and/or magnitude of error in the pipelined ADC 100 when compared to a pipelined ADC that does not include the metastability detector 114 and/or the metastability correction of the digital backend.

For example, in one embodiment an ideal digital value 105 output by an ADC 104 may be "010" corresponding to 0.51 volts (V). However, a comparator 112 of the ADC 104 may not have fully and/or properly regenerated, causing the comparator 112 to operate under metastable conditions. Therefore, the ADC 104 may output a digital value 105 of "001" as a result of the metastability of the comparator 112. The metastability detector 114 may determine, based on the differential output of the comparator 112, that the comparator 112 is operating under metastable conditions and may provide the digital backend 116 with an output that indicates the metastability of the comparator 112. The digital backend 116 may determine that the comparator 112, which the metastability detector 114 has indicated as operating under metastable conditions, corresponds to a reference signal of 0.5V, and thus causes a transition in the digital value 105 output by the ADC 104 when the analog input 103 of the ADC 104 exceeds 0.5V. The digital backend 116 may then replace the erroneous digital value 105 output by the ADC 104 (e.g., "001") with an estimated digital value output of the ADC 104 (e.g., "010") based at least on the magnitude of the reference signal (0.5V) when the comparator 112 is not operating under metastable conditions. In this way, the metastability detector 114 and the digital backend 116 may enable correction of an error in a digital value 105 output by the ADC 104, thereby increasing a precision of a digital value output by the pipelined ADC 100 when compared to a pipelined ADC that does not include the metastability detector 114.

The digital backend 116 may, in some embodiments, predetermine the estimated digital value output and store the estimated digital value output such that the digital backend 116 may later retrieve the estimated digital value output from a data store 118 (e.g., a database, a lookup table, or any other suitable form of data storage accessible by the digital backend) based at least in part on the output of the metastability detector 114 (e.g., the output of the metastability detector 114 that indicates a particular comparator 112 that corresponds to a particular reference signal and expected output). For example, the digital backend 116 may predetermine the estimated output for each comparator 112 in the ADC 104 and/or for each ADC 104 in each segment 102 of the pipelined ADC 100 in advance based on a nominal output of the comparators 112 corresponding to the respective reference signals received by each of the comparators 112 and store the estimated output for each of the comparators in the data store 118. When a metastability detector 114 indicates to the digital backend 116 that a comparator 112 is operating under metastable conditions, the digital backend 116 may determine, for example because of the one-to-one relationship of each metastability detector 114 to a particular comparator 112, which comparator 112 is operating under metastable conditions, and therefore which estimated output to retrieve from the data store 118. While the data store 118 is illustrated in FIG. 1 as being separate from the digital backend 116, in some embodiments, the data store 118 may be implemented within, or as a portion of, the digital backend 116.

In some embodiments, the metastability detector 114 may itself be operating under metastable conditions (e.g., because the output of the metastability detector 114 may not have fully regenerated, as defined above). Such possible metastability of the metastability detector 114 may prevent the digital backend 116 from replacing an output of a comparator 112 that is operating under metastable operating conditions with an estimated output from the data store 118 by causing the metastability detector 114 to erroneously indicate to the digital backend 116 that the comparator 112 is not operating under metastable operating conditions. To compensate for this possibility, the metastability detector 114 may optionally be coupled to one or more components (not shown) that may be configured to store the output of the metastability detector 114 prior to transmission of the output of the metastability detector 114 to the digital backend 116. For example, each metastability detector 114 may be coupled to one or more latches and/or one or more digital flip-flops or other like components that may be configured to store the output of the metastability detector 114 (e.g., based on a high or low portion of a clock signal). The repeated process of storing the output of the metastability detector 114 may, in some embodiments, reduce a likelihood of the output of the metastability detector 114 being metastable when it reaches the digital backend 116, and may therefore reduce a possibility of the digital backend 116 receiving an erroneous indication of a comparator 112 operating, or not operating, under metastable operating conditions. A quantity of the one or more components which may be coupled together and configured to store the output of the metastability detector 114 may be determined, for example, based at least in part on a quantity of segments 102 in the pipelined ADC 100.

Figure 2:
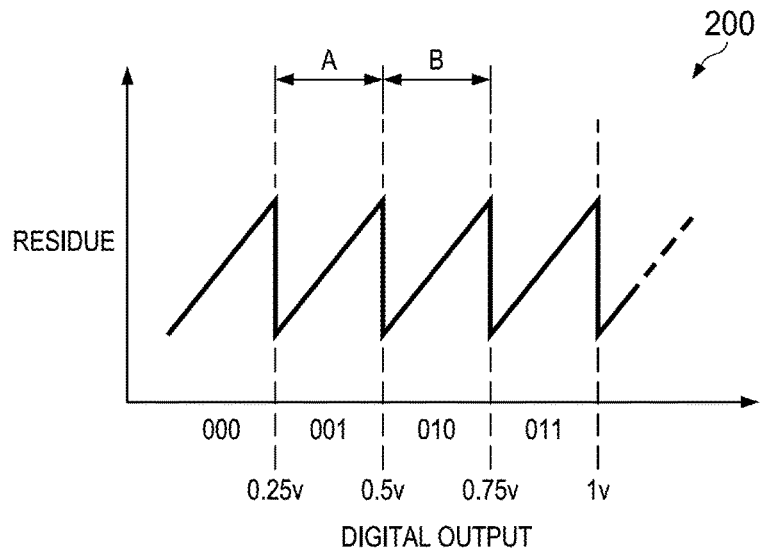
FIG. 2 shows an example of a residue plot of a segment of a pipelined ADC in accordance with various embodiments.

FIG. 2 shows an example of a residue plot 200 of a segment of a pipelined ADC in accordance with various embodiments. The residue plot 200 may be indicative of an analog input signal (e.g., an initial analog input (e.g., analog input 103) of the pipelined ADC or a residual output signal from a preceding segment of a pipelined ADC) and a digital output of an ADC 104 of a segment 102 of the pipelined ADC 100. In FIG. 2, the vertical axis of the residue plot 200 represents the analog input signal (which may be measured in volts) and the horizontal axis of the residue plot 200 represents the digital output (as represented by digital bits corresponding to defined threshold voltages). As the analog input voltage rises (e.g., with respect to zero volts and/or a prior threshold value such as a reference value of a comparator of an ADC), the analog input voltage nears a threshold or reference value (e.g., a transition point) that causes a transition in an output of a respective comparator from "0" to "1."

When the analog input voltage reaches the threshold or reference value that causes a transition in an output of a respective comparator, the comparator may cause a change in the digital value output by the ADC. For example, as shown in FIG. 2, when the analog input voltage reaches 0.25V a first comparator may cause the digital value output of the ADC to be "001." When the analog input voltage reaches 0.5V, a second comparator may cause the digital value output by the ADC to be "010." However, if the second comparator is operating under metastable conditions (e.g., because the second comparator has not fully regenerated), the second comparator may output an incorrect value. For example, the second comparator may incorrectly output a "0" when the second comparator should output a "1" based on the analog input voltage and the threshold or reference value. This incorrect output may cause the ADC 104 (e.g., via the encoder 120) to indicate via the digital value 105 that the ADC 104 is operating in region A (e.g., for analog input voltages within the voltage range $0.25V \leq x < 0.5V$) when the ADC 104 is actually operating in region B (e.g., for analog input voltages within the voltage range $0.5V \leq x < 0.75V$). In this scenario, the incorrect output of the second comparator may affect both the digital value output by the ADC, as well as digital values output by subsequent segments in the pipelined ADC (e.g., because of the residual output passed from the segment of the pipelined ADC to a subsequent segment in the pipelined ADC). This may propagate the error of the second comparator throughout the pipelined ADC and may potentially cause a significant error in a final digital value output by the pipelined ADC.

However, when a metastability detector, as discussed above, is coupled to the second comparator, the metastability detector may indicate to a digital backend, as discussed above, that the second comparator is operating under metastable conditions. Because it is known that the second comparator may be metastable near its threshold or reference value, the digital backend may estimate that the analog input signal is at least 0.5V and in region B rather than being less than 0.5V and in region A, as indicated by the ADC. As such, the digital backend may replace the incorrect digital value output by the ADC (e.g., "001") with an estimate of the correct digital value output (e.g., "010") determined according to the 0.5V threshold or reference value of the second comparator, thereby reducing, in some embodiments, a resulting error in the final digital value output by the pipelined ADC when compared with a pipelined ADC that does not include a metastability detector.

Figure 3:
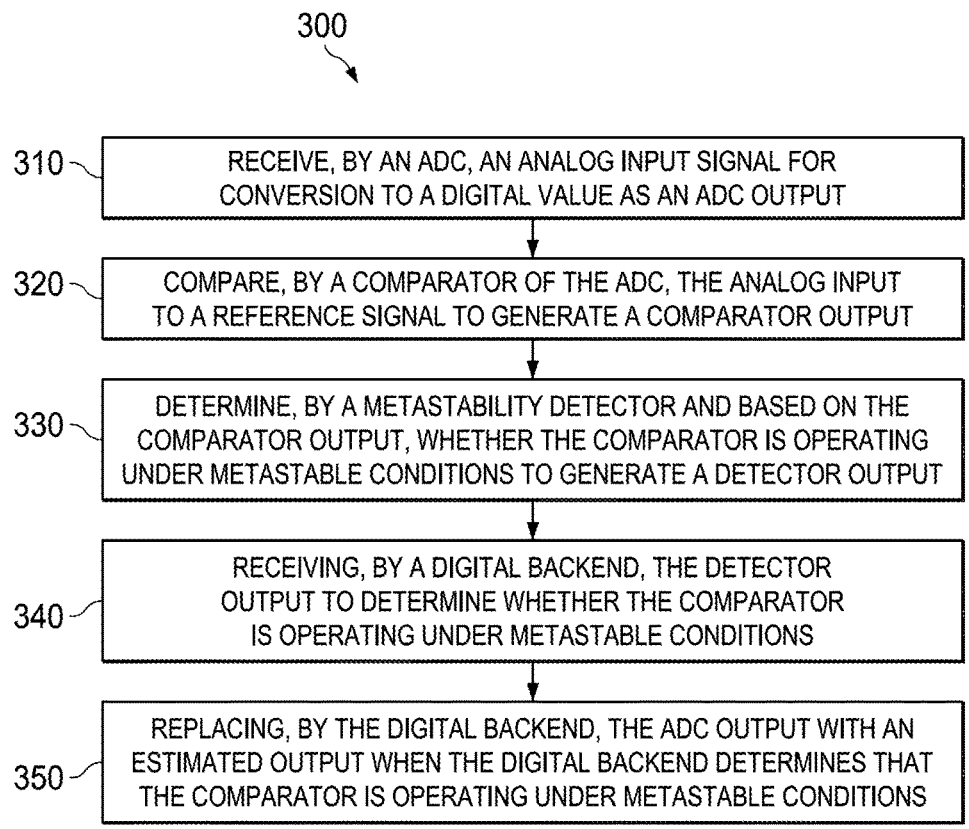
FIG. 3 shows a flowchart of a method for ADC metastability detection and correction in accordance with various embodiments.

FIG. 3 shows a flowchart of a method 300 for ADC metastability detection and correction in accordance with various embodiments. The method 300 may be implemented, for example, in an ADC, such as the ADC 104, in a pipelined ADC, such as the pipelined ADC 100, both as discussed above. The method 300 may be implemented to, for example, determine whether a comparator of the ADC is operating under metastable conditions, thereby potentially causing an error in an output of the ADC and/or the pipelined ADC. The method 300 may be further implemented to correct for the determined error by, for example, replacing an incorrect or erroneous output of the ADC with an estimated output based on an expected result of the ADC for a given analog input voltage and comparator threshold or reference signal (e.g., reference voltage).

At step 310, an ADC may receive an analog input signal for conversion to a digital value that may be represented by one or more digital bits. The analog input signal may be, for example, an analog input signal received by a pipelined ADC for conversion to a digital value, or may be a residual signal (or residue signal) received from a segment of a pipelined ADC in which the analog input signal has been processed and/or manipulated to form the residual signal. The ADC may be, in some embodiments, a flash ADC that may include a plurality of comparators that may each be configured to compare the analog input signal to one of a plurality of reference signals.

At step 320, a comparator of the ADC may compare the analog input signal to a reference signal and generate a comparator output. The comparator output may be, for example, a "1" when the analog input signal exceeds the reference signal or a "0" when the analog input signal does not exceed the threshold. Alternatively, the comparator may be operating under metastable conditions in which the output is neither a "1" nor a "0" and therefore results in an error in an output of the comparator and, consequently, the ADC.

At step 330, a metastability detector may determine, based on the comparator output (e.g., a differential output of the comparator), whether the comparator is operating under metastable conditions. The metastability detector may perform the detection by comparing a first of the differential output signals of the comparator to a second of the differential output signals of the comparator, or by comparing one or more of the differential output signals of the comparator to one or more reference signals. When the comparator is operating under metastable conditions, the metastability detector may generate a detector output of "1" to indicate such operation and may output a detector output of "0" otherwise. At step 340, a digital backend (e.g., a processor or other form of digital logic) may receive the output of the metastability detector and determine, based on the output of the metastability detector, whether the comparator is operating under metastable conditions.

At step 350, when the comparator is operating under metastable conditions, the digital backend may replace an output of the ADC containing the comparator with an estimated output to compensate and/or correct for the metastability. Compensating and/or correcting for the metastability may reduce an error rate of the ADC, and therefore the pipelined ADC as a whole, when compared to an error rate of the ADC and pipelined ADC without compensation and/or correction for the metastability. The estimated output may be determined, at least in part, according to which comparator in the ADC is operating under metastable conditions, a minimum and/or maximum of a residual signal associated with the ADC, a reference signal, predetermined estimates, and or other suitable criteria. For example, a given comparator in the ADC may be known to receive a reference signal having a predefined voltage.

The comparator may operate under metastable conditions when the analog input signal is very near to the voltage of that reference signal. As such, the digital backend may, in some embodiments, assume that an analog input signal of a comparator that is operating under metastable conditions is equal to or greater than, but near, the voltage of the reference signal of that comparator. Therefore, the digital backend may determine a nominal output of the comparator based at least in part on the reference signal. For example, the digital backend may determine that for a reference signal having a voltage of X volts, a nominal output of the comparator may be α. The digital backend may further determine that for a reference signal having a voltage of Y volts, a nominal output of another comparator in the ADC may be β. The nominal outputs may be determined, for example, based on ideal circumstances in which the comparators do not suffer from metastability and transition precisely, or approximately precisely, at the voltage of their respective reference signals.

The digital backend may replace an output of the ADC (e.g., an erroneous output based on the comparator that is operating under metastable conditions outputting a "0" rather than a "1") with an estimated output that is based on a nominal output of the comparator and the ADC for an analog input signal that exceeds the voltage of the comparator's reference signal but does not exceed a voltage of a reference signal of a subsequent comparator in the ADC. The digital backend may, in some embodiments, predetermine the estimated output and store the estimated output such that the digital backend may later retrieve the estimated output from a data store, as discussed above with respect to FIG. 1

Optionally, the method 300, in some embodiments, may further include transmitting the estimated output to a DAC for further processing prior to transmission to a subsequent portion (e.g., a subsequent segment) of a pipelined ADC.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other intervening devices and/or connections. Unless otherwise stated, "approximately" means +/−10 percent of the stated value or reference value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
a first comparator configured to compare an input signal to a reference signal to determine whether the input signal exceeds the reference signal and output a comparator output based on the determination, wherein an ADC output is based at least in part on the comparator output; and a metastability detector coupled to the first comparator and configured to determine, based at least in part on the comparator output, that the first comparator is operating under metastable conditions and output a metastability detector output, wherein metastability occurs when output of the first comparator represents neither a digital 1 nor a digital 0 determined when:

$$abs(Op-Om)<Vx$$

where: Op is a positive output of a differential output of the first comparator;
Om is a negative output of a differential output of the first comparator;
Vx is a predetermined reference level;
Abs (x) corresponds to the absolute value of x; and
wherein the metastability detector comprises a second comparator, the second comparator coupled to an output of the first comparator.

2. The ADC of claim 1, wherein the metastability detector is coupled to a digital backend configured to correct an error in the ADC output by replacing the ADC output with an estimated output.

3. The ADC of claim 2, wherein the estimated output is determined by the digital backend based at least in part on the reference signal.

4. The ADC of claim 2, wherein the digital backend retrieves the estimated output from a data store based at least in part on the metastability detector output.

5. The ADC of claim 1, wherein the metastability detector comprises at least one of an exclusive OR (XOR) digital logic gate, a negative OR (NOR) digital logic gate, and an AND digital logic gate.

6. The ADC of claim 1, wherein the metastability detector further comprises a logic gate, the logic gate coupled to an output of the second comparator.

7. The ADC of claim 1, wherein the metastability detector further comprises a latch coupled to the output of the second comparator.

8. A pipelined apparatus, comprising:
a segment configured to receive an input signal, the segment comprising:
an analog-to-digital converter (ADC) comprising:
a first comparator configured to:
receive the input signal,
compare the input signal to a reference signal to determine whether the input signal exceeds the reference signal, and
output a comparator output based on the determination;
a metastability detector coupled to the first comparator and configured to determine that the first comparator is operating under metastable conditions and output a metastability detector output, wherein the determining that the first comparator is operating under metastable conditions comprises determining that metastability occurs when output of the first comparator represents neither a digital 1 nor a digital 0 determined when:

$$abs(Op-Om)<Vx$$

where: Op is a positive output of a differential output of the first comparator;
Om is a negative output of a differential output of the first comparator;
Vx is a predetermined reference level;
Abs (x) corresponds to the absolute value of x;

and wherein the metastability detector comprises a second comparator, the second comparator coupled to an output of the first comparator;
an encoder coupled to the ADC and configured to receive the comparator output and generate an ADC output based at least in part on the comparator output;
a digital-to-analog converter (DAC) coupled to the ADC and the encoder and configured to convert the ADC output to an analog output signal; and
a subtractor coupled to the input signal and the DAC and configured to subtract the analog output signal from the input signal to form a residual output signal.

9. The pipelined apparatus of claim 8, wherein the segment further comprises an amplifier coupled to the subtractor and configured to amplify the residual output signal received from the subtractor.

10. The pipelined apparatus of claim 8, further comprising a digital backend coupled to the metastability detector and configured to correct the ADC output when the metastability detector indicates that the first comparator is operating under metastable conditions.

11. The pipelined apparatus of claim 10, wherein the digital backend corrects the ADC output by replacing the ADC output with an estimated output.

12. The pipelined apparatus of claim 11, wherein the digital backend determines the estimated output based at least on a magnitude of the reference signal.

13. The pipelined apparatus of claim 8, wherein the metastability detector comprises at least one of an exclusive OR (XOR) digital logic gate, a negative OR (NOR) digital logic gate, and an AND digital logic gate.

14. A method of analog-to-digital converter (ADC) metastability detection and correction, comprising:
receiving, by an ADC, an analog input signal for conversion to a digital value as an ADC output;
comparing, by a first comparator of the ADC, the analog input signal to a reference signal to generate a comparator output;
determining, by a second comparator of a metastability detector, that the first comparator is operating under metastable conditions wherein metastability occurs when output of the first comparator represents neither a digital 1 nor a digital 0 determined when:

$$abs(Op-Om)<Vx$$

where: Op is a positive output of a differential output of the first comparator;
Om is a negative output of a differential output of the first comparator;
Vx is a predetermined reference level;
Abs (x) corresponds to the absolute value of x;
to generate a detector output based on the first comparator output; and
replacing, by a digital backend, the ADC output with an estimated output upon the digital backend receiving the detector output indicating that the first comparator is operating under metastable conditions.

15. The method of claim 14, wherein replacing the ADC output with the estimated output comprises determining a nominal output of the first comparator, based at least in part on the reference signal, as the estimated output.

16. The method of claim 14, wherein replacing the ADC output with the estimated output further comprises retrieving the estimated output from a data store based at least in part on the detector output.

17. The method of claim 15, wherein the metastability detector comprises at least one of an exclusive OR (XOR) digital logic gate, a negative OR (NOR) digital logic gate, and an AND digital logic gate.

18. The method of claim 14, further comprising:
   transmitting the estimated output to a digital-to-analog converter (DAC) in a segment of the ADC, wherein the ADC is a pipelined ADC.

\* \* \* \* \*